United States Patent
Hwang et al.

(10) Patent No.: US 11,058,015 B2
(45) Date of Patent: Jul. 6, 2021

(54) HOUSING, METHOD OF PRODUCING THE SAME, AND ELECTRONIC DEVICE INCLUDING THE SAME

(71) Applicant: Samsung Electronics Co., Ltd., Suwon-si (KR)

(72) Inventors: Hangyu Hwang, Suwon-si (KR); Changsu Kim, Suwon-si (KR); Dukjin Kim, Suwon-si (KR); Sooyoung Kim, Suwon-si (KR); Jongyoul Noh, Suwon-si (KR); Sangsik Na, Suwon-si (KR); Jongbae Jeon, Suwon-si (KR); Rathore Pranveer Singh, Suwon-si (KR); Ingook Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/655,938

(22) Filed: Oct. 17, 2019

(65) Prior Publication Data

US 2020/0236796 A1    Jul. 23, 2020

(30) Foreign Application Priority Data

Jan. 17, 2019  (KR) .................. 10-2019-0006323

(51) Int. Cl.
*H05K 5/00* (2006.01)
*B29C 45/27* (2006.01)

(52) U.S. Cl.
CPC ....... *H05K 5/0017* (2013.01); *B29C 45/2708* (2013.01); *H05K 5/0034* (2013.01)

(58) Field of Classification Search
CPC ............... H05K 5/0017; H05K 5/0034; B29C 45/2708; B29C 2045/0027; B29C 45/0025; B29L 2031/3481
See application file for complete search history.

(56) References Cited

U.S. PATENT DOCUMENTS

| | | | | |
|---|---|---|---|---|
| 5,967,637 A | * | 10/1999 | Ishikawa | B29C 45/0025 264/1.1 |
| 6,623,684 B1 | * | 9/2003 | Satoh | B29C 45/0025 264/259 |
| 2005/0270787 A1 | * | 12/2005 | Gross | B29C 45/0025 362/487 |
| 2011/0278186 A1 | * | 11/2011 | Sung | H01Q 1/243 206/320 |
| 2014/0043771 A1 | * | 2/2014 | Isoda | H05K 7/02 361/728 |

(Continued)

*Primary Examiner* — Abhishek M Rathod
(74) *Attorney, Agent, or Firm* — Jefferson IP Law, LLP

(57) ABSTRACT

An electronic device is provided. The electronic device includes a housing including a first plate, a second plate facing in a direction opposite to that of the first plate, and a side member enclosing a space between the first plate and the second plate and formed with a method of solidifying a resin including a predetermined amount of rigidity reinforcing material injected into an injection mold and including a plurality of side surfaces, and a gate mark receiving portion formed in each of the plurality of side surfaces of the side member and configured to receive at least one gate mark according to separation of the injection mold. The gate mark receiving portion is formed by a processing portion disposed at a corresponding position inside a cavity of the injection mold.

15 Claims, 15 Drawing Sheets

(56) References Cited

U.S. PATENT DOCUMENTS

| | | | |
|---|---|---|---|
| 2014/0302361 A1* | 10/2014 | Han | H01M 50/691 |
| | | | 429/82 |
| 2015/0029586 A1* | 1/2015 | Clerc | B29C 45/0025 |
| | | | 359/488.01 |
| 2015/0197049 A1 | 7/2015 | Olaru | |
| 2016/0288389 A1 | 10/2016 | Olaru | |
| 2017/0244153 A1* | 8/2017 | Chen | H01Q 1/48 |
| 2019/0164933 A1* | 5/2019 | Lee | H01L 24/20 |

\* cited by examiner

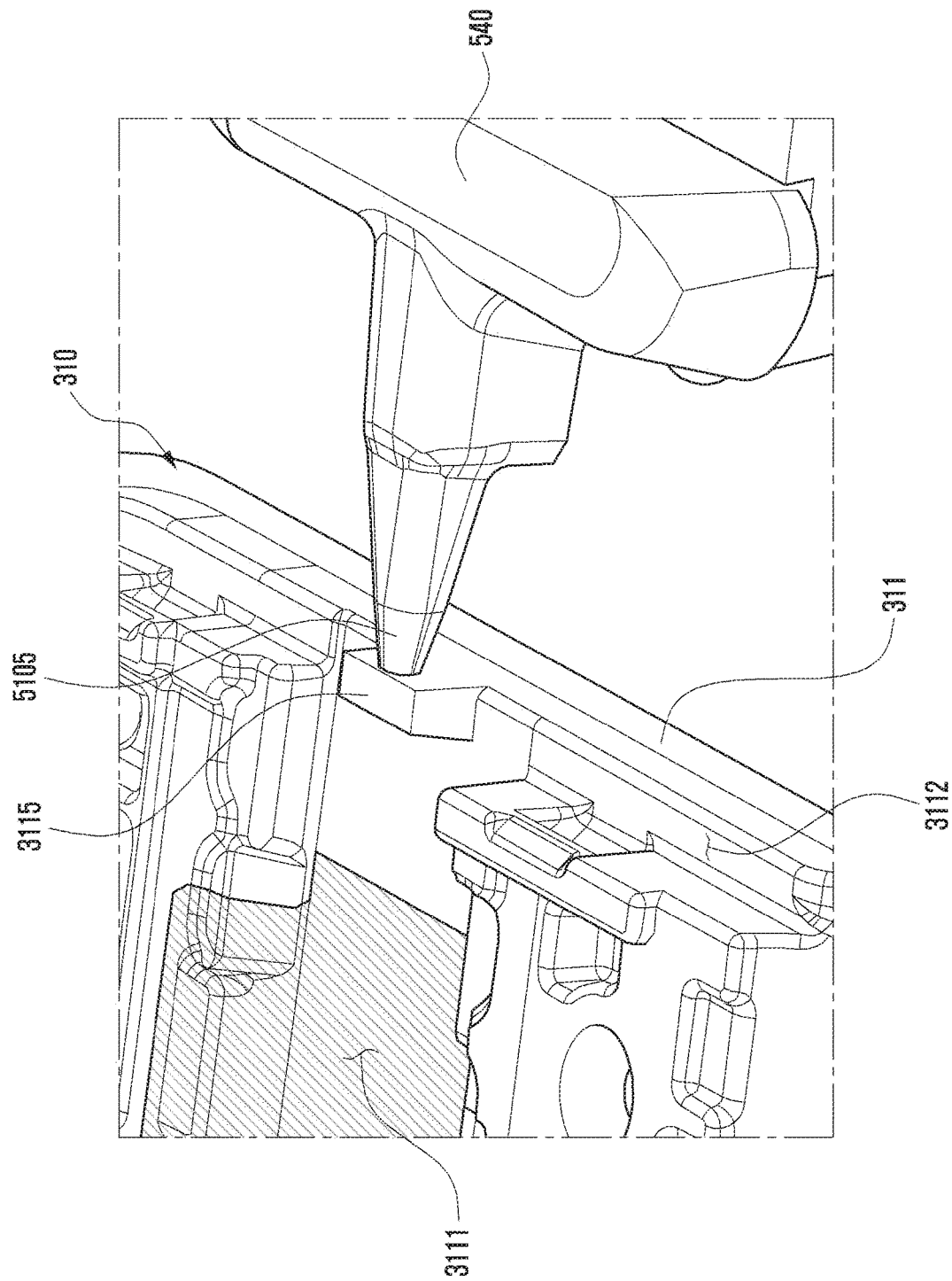

HOUSING, METHOD OF PRODUCING THE SAME, AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2019-0006323, filed on Jan. 17, 2019, in the Korean Intellectual Property Office, the disclosure of which is incorporated by reference herein in its entirety.

BACKGROUND

1. Field

The disclosure relates to a housing. More particularly, the disclosure relates to a method of producing the same, and an electronic device including the same.

2. Description of Related Art

With the development of electronic devices, for example, mobile electronic devices, the electronic devices have been applied to various fields that are closely related to individual's lives. The electronic devices are released in various sizes according to functions and user preferences thereof, thus, a function and slimming thereof and external beauty thereof are a concern. Although electronic devices of one company have substantially the same functions as those of other companies, differentiated devices having a more enhanced design and excellent durability may be more preferred by users.

Recently, with significant decreases in the functional gap of each manufacturer of electronic devices, it is a trend to increase the rigidity of the electronic device, which is becoming slimmer, and to strengthen the design aspect. As part of this trend, at least a portion of various structures (e.g., housing) of the electronic device may be implemented with a metal material to help reinforce rigidity of the slimmed electronic device.

With gradual slimming, electronic devices may include a housing (e.g., side member or side support member) in which heterogeneous materials are formed by an insert injection method for rigidity reinforcement. For example, the housing may be formed by insert injection of a high temperature resin (e.g., polymer) into a metal bracket. Further, in order to prevent damage of a display (e.g., liquid crystal display (LCD) or on cell touch AMOLED (OCTA)) occurring when the electronic device falls, injection using a high temperature resin in which a high content of rigidity reinforcing material (e.g., glass fiber (GF)) is added to an engineering plastic resin may help rigidity reinforcement of the electronic device. When a resin including such a high content of rigidity reinforcing material is used, a hot runner mold cannot be applied because of a poor appearance/product deformation problem caused by the resin slowly hardening at a nozzle of the injection mold. Further, when flowability of the resin increases according to addition of a material for rigidity reinforcement, a problem may occur that the resin flows unintentionally from the nozzle of the mold before injection. Therefore, in order to solve the above problems, when a cold runner mold is used, scraps are generated after injection, as in a sprue, a runner, and/or a gate land, thus, a problem of a rise in a production cost may occur.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a housing, a method of producing the same, and an electronic device including the same.

Another aspect of the disclosure is to provide a housing, a method of producing the same, and an electronic device including the same that can be produced through a hot runner type injection mold, even if a high content of rigidity reinforcing material is included.

Another aspect of the disclosure is to provide a housing, a method of producing the same, and an electronic device including the same that can reduce a production cost through scrap elimination after injection.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate, a second plate facing in a direction opposite to that of the first plate, and a side member enclosing a space between the first plate and the second plate and formed with a method of solidifying a resin including a predetermined amount of rigidity reinforcing material injected into an injection mold and including a plurality of side surfaces, and a gate mark receiving portion formed in each of the plurality of side surfaces of the side member and configured to receive at least one gate mark according to separation of the injection mold, wherein the gate mark receiving portion is formed by a processing portion disposed at a corresponding position inside a cavity of the injection mold.

In accordance with another aspect of the disclosure, an electronic device is provided. The electronic device includes a housing including a first plate, a second plate facing in a direction opposite to that of the first plate, and a side member enclosing a space between the first plate and the second plate and including a plurality of side surfaces, and at least one gate mark formed in each of the plurality of side surfaces of the side member, wherein the side member is injected as a resin including a rigidity reinforcement material having a predetermined content.

In accordance with another aspect of the disclosure, a housing formed by a method of solidifying a resin injected into an injection mold is provided. The method includes a front surface, a rear surface facing in a direction opposite to that of the front surface, a plurality of side surfaces enclosing a space between the front surface and rear surface, and a gate mark receiving portion formed at each of the plurality of side surfaces and configured to receive at least one gate mark according to separation of the injection mold, wherein the gate mark receiving portion is formed by a processing portion disposed at a corresponding position inside a cavity of the injection mold.

In accordance with another aspect of the disclosure, a method of producing a housing is provided. The method includes forming a processing portion at a corresponding location inside a cavity of an injection mold corresponding to a gate mark receiving unit configured to receive at least one gate mark formed in side surfaces of the housing, and forming the housing through solidification of a resin including a predetermined amount of rigidity reinforcing material injected through a side gate connected to the cavity.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 8A and 8B are diagrams illustrating a configuration of an injection mold including a gate mark receiving groove according to various embodiments of the disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
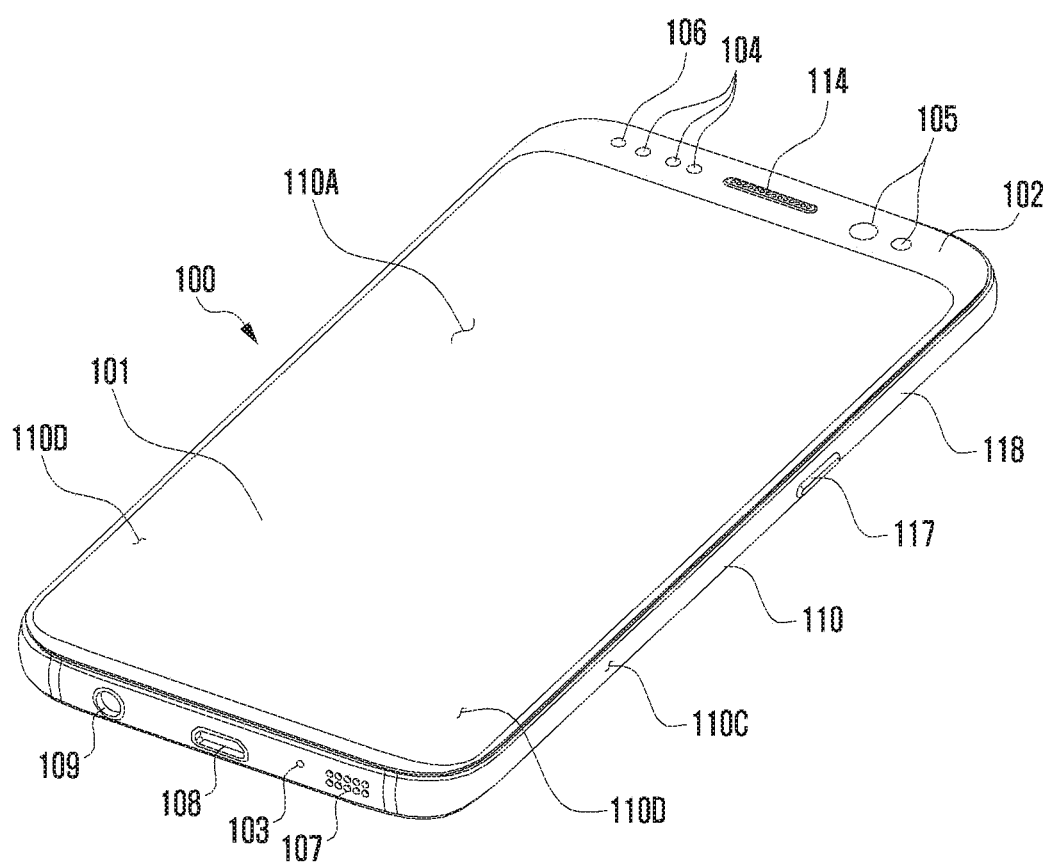
FIG. 1 is a front perspective view illustrating a mobile electronic device according to an embodiment of the disclosure.

FIG. 1 is a perspective view showing a front surface of a mobile electronic device according to an embodiment of the disclosure.

Figure 2:
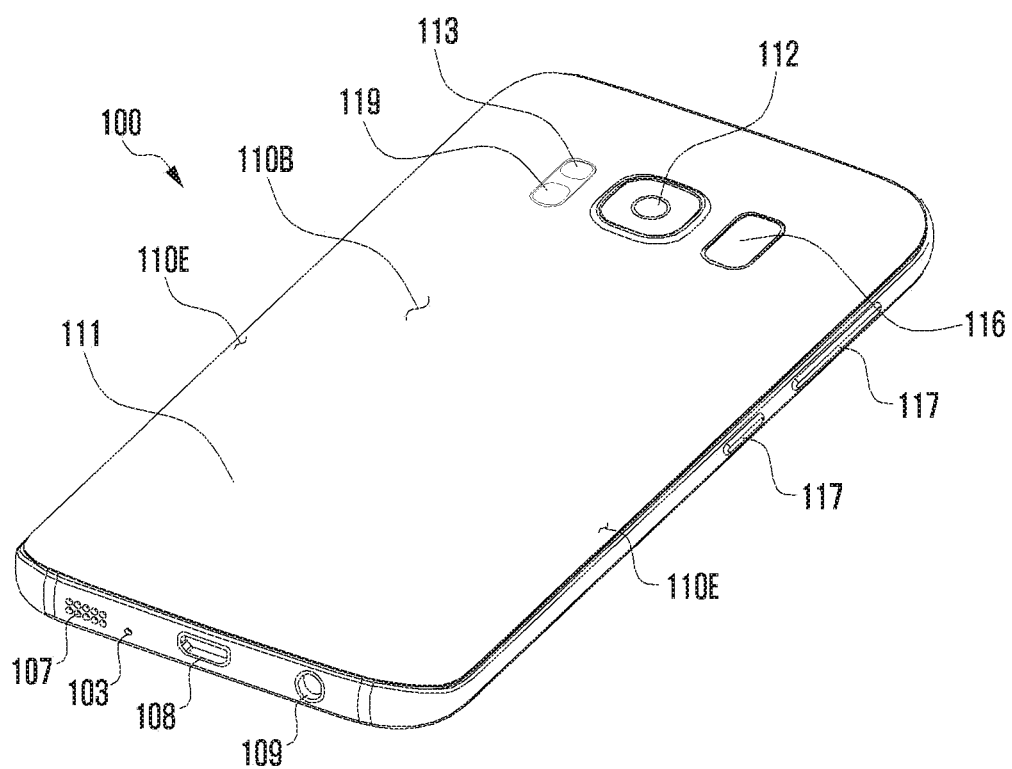
FIG. 2 is a rear perspective view illustrating the electronic device of FIG. 1, according to an embodiment of the disclosure.

FIG. 2 is a perspective view showing a rear surface of a mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104, 116 and 119, camera modules 105, 112 and 113, a key input device 117, a light emitting device 106, and connector holes 108 and 109. The mobile electronic device 100 may omit at least one (e.g., the key input device 117 or the light emitting device 106) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device 106. At least one of the audio module 114, the sensor module 104, the camera module 105, the fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device 106 may be disposed on the first surface 110A of the housing 110. For example, the light emitting device 106 may provide status information of the electronic device 100 in an optical form. The light emitting device 106 may provide a light source associated with the operation of the camera module 105. The light emitting device 106 may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Figure 3:
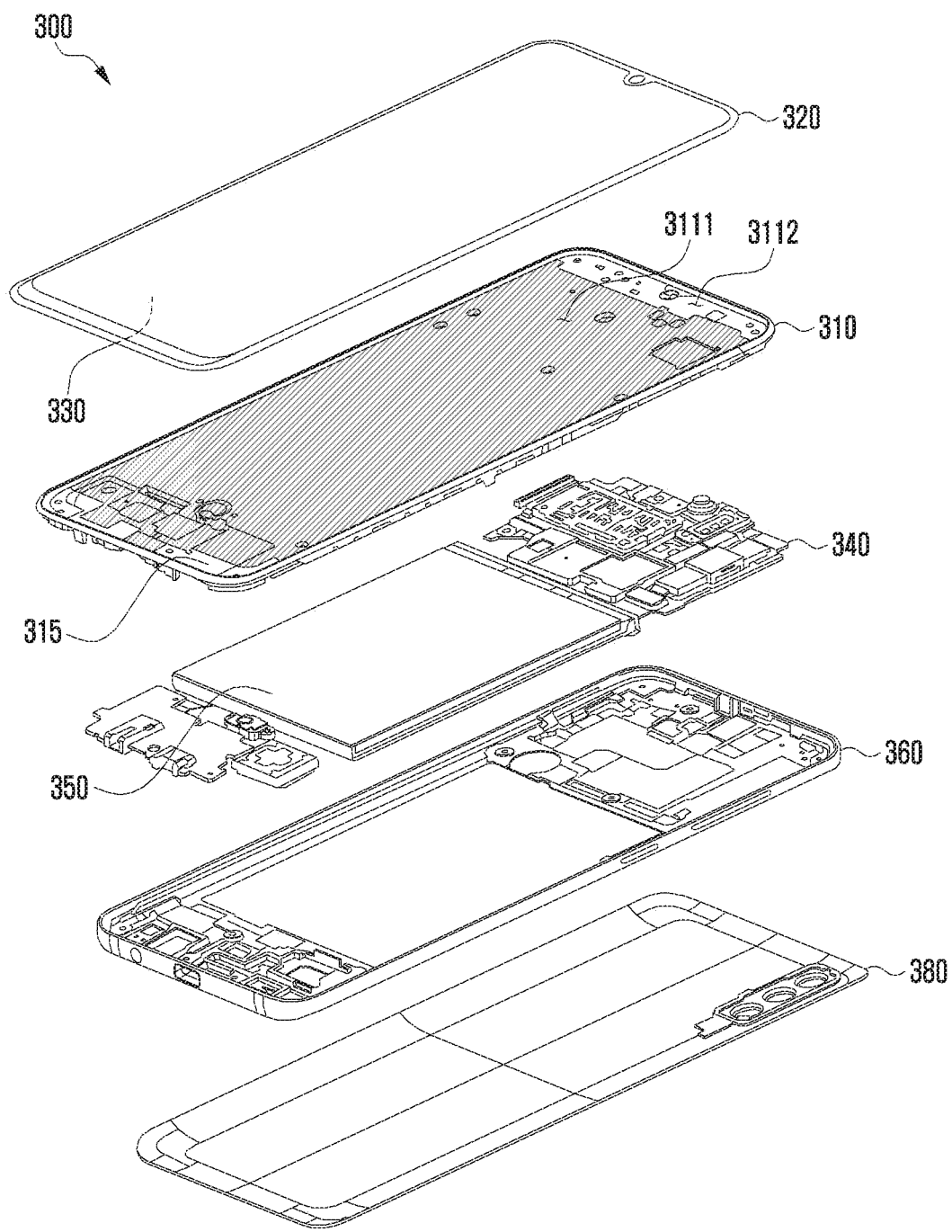
FIG. 3 is an exploded perspective view illustrating an electronic device according to an embodiment of the disclosure.

FIG. 3 is an exploded perspective view showing a mobile electronic device shown in FIG. 1 according to an embodiment of the disclosure.

Referring to FIG. 3, a mobile electronic device 300 may include a lateral bezel structure 310, a first support member 315 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 315 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 315 is disposed inside the mobile electronic device 300 and may be connected to, or integrated with, the lateral bezel structure 310. The first support member 315 may be formed of, for example, a metallic material and/or a non-metal (e.g., polymer) material. The first support member 315 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

According to various embodiments, the electronic device 300 may include a front plate 320 (e.g., transparent window), a rear plate 380 facing in a direction opposite to that of the front plate 320, the first support member 315 positioned in a space between the front plate 320 and the rear plate 380, and a side member 310 enclosing a side space between the front plate 320 and the rear plate 380 and integrally formed with or connected to the first support member 315. According to an embodiment, the side member 310 may be formed in a part of a housing forming at least a part of an external shape of the electronic device and be integrally formed with at least a portion of the first support member 315.

According to various embodiments, the front plate 320 may be formed to be substantially transparent so as to expose the display 330 through at least a portion. According to an embodiment, the first support member 315 may be coupled to the display 330 at one surface facing the front plate 320 and be coupled to the printed circuit board 340 and the battery 350 at the other surface.

According to various embodiments, in order to reinforce rigidity of the electronic device 300, at least a partial area of the side bezel structure 310 (e.g., the side member or the housing) may be formed with a conductive portion 3111 (e.g., metal member). According to one embodiment, the side bezel structure 310 may include a non-conductive portion 3112 (e.g., polymer portion) insert injected into the conductive portion 3111. According to one embodiment, the non-conductive portion 3112 of the side bezel structure 310 may be formed in a manner in which a high temperature resin is solidified after being injected into a cavity formed by an injection mold. According to one embodiment, the high temperature resin may include a high content of rigidity reinforcement material for mechanical rigidity reinforcement. According to one embodiment, the high temperature resin including the rigidity reinforcing material is injected directly through a side gate formed with at least one side surface of the side bezel structure 310 through a hot runner injection mold, thereby eliminating generation of scraps discharged by a cold runner injection mold to help reduce a production cost.

Hereinafter, a method of producing a side member (e.g., side bezel structure or housing) and an electronic device produced using the same will be described in detail.

Figure 4A:
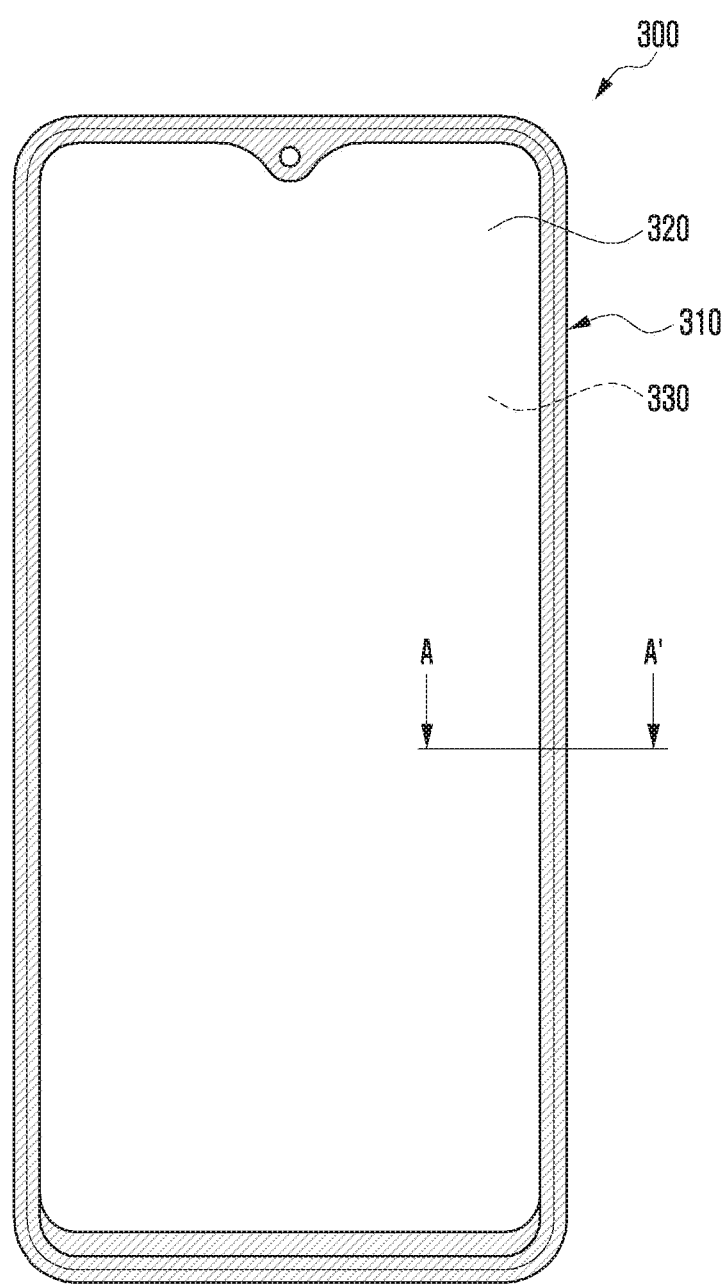
FIG. 4A is a plan view illustrating an electronic device according to an embodiment of the disclosure.

FIG. 4A is a plan view illustrating an electronic device 300 according to an embodiment of the disclosure.

Figure 4B:
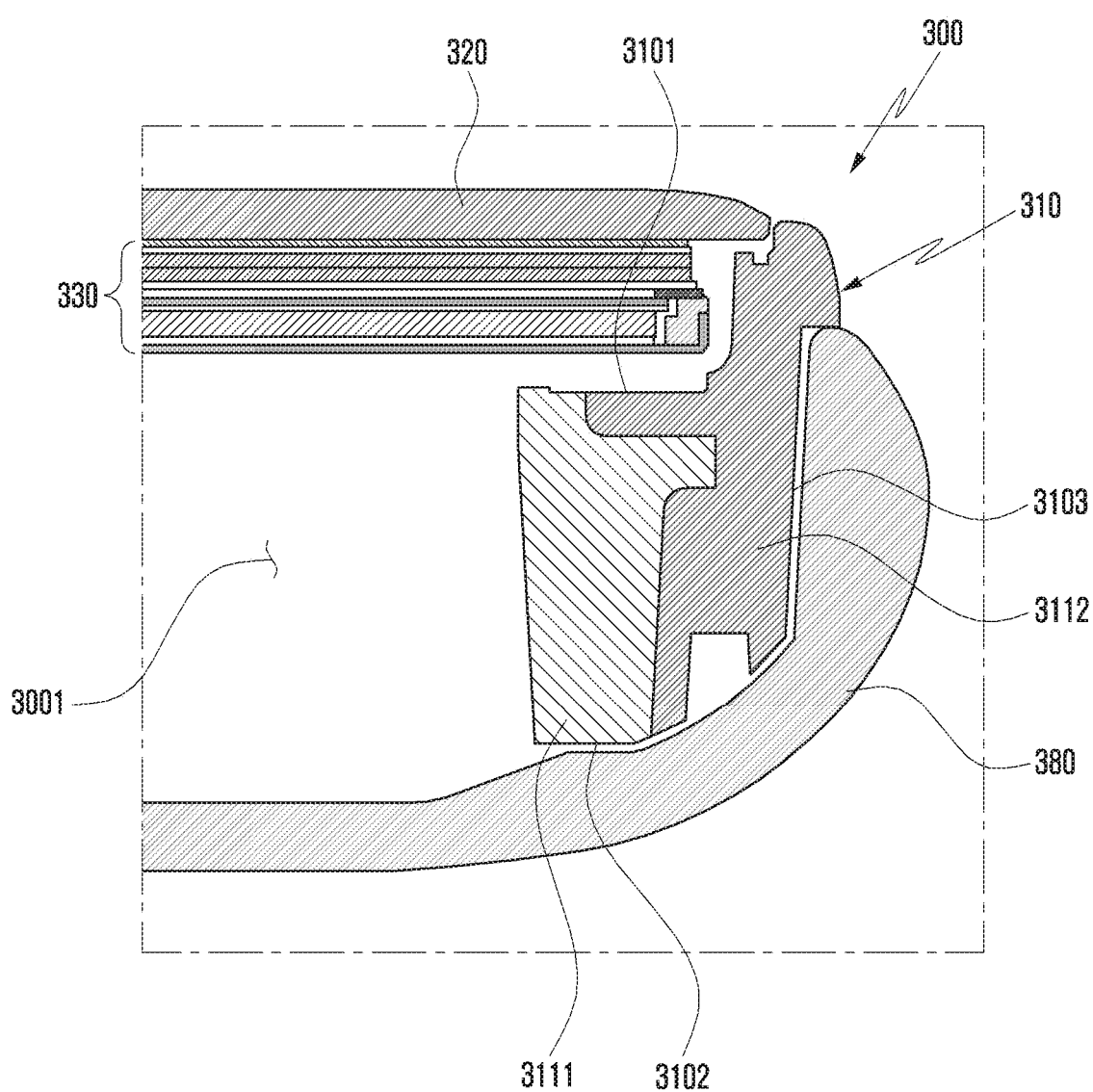
FIG. 4B is a cross-sectional view illustrating the electronic device taken along line A-A' of FIG. 4A, according to an embodiment of the disclosure.

FIG. 4B is a cross-sectional view illustrating the electronic device 300 taken along line A-A' of FIG. 4A, according to an embodiment of the disclosure.

Referring to FIGS. 4A and 4B, the electronic device 300 may include the front plate 320 (e.g., first plate), the rear plate 380 (e.g., second plate) facing in a direction opposite to that of the front plate 320, and the side member 310 (e.g., the side bezel structure 310 of FIG. 3) enclosing a space 3001 between the front plate 320 and the rear plate 380. According to an embodiment, the electronic device 300 may include a display 330 disposed inside the space 3001 and disposed to be at least partially visible from the outside through the front plate 320 of a transparent material. According to an embodiment, the display 330 may include a flexible display. According to an embodiment, the display 330 may include a flexible touch display. The side member 310 may include a front surface 3101 facing the front plate and a rear surface 3102 facing the rear plate.

According to various embodiments, in order to reinforce rigidity of the electronic device 300, the side member 310 may include a conductive portion 3111 (e.g., metal member) and a non-conductive portion 3112 (e.g., polymer portion) insert injected into the conductive portion 3111. According to one embodiment, at least a portion of the non-conductive portion 3112 may contribute to a side surface 3103 of the electronic device 300. For example, at least a portion of the non-conductive portion 3112 may be disposed as a portion of an external shape that may be visible from the outside of the electronic device 300. In another embodiment, at least a portion of the non-conductive portion 3112 may be disposed to be visible from the outside of the electronic device 300 and be extended to at least a portion of the internal space 3001 of the electronic device 300. According to one embodiment, the non-conductive portion 3112 may be formed as at least a portion of the above-described first support structure (e.g., the first support member 315 of FIG. 3).

According to various embodiments, as a high temperature resin is solidified after being injected through a cavity of an injection mold, the non-conductive portion 3112 may be formed. According to an embodiment, the resin may include a high content of rigidity reinforcing material for mechanical rigidity reinforcement. According to one embodiment, the rigidity reinforcing material may include at least one inorganic filler. According to one embodiment, the rigidity reinforcing material may include at least one of glass fiber (GF), mineral filler (MF), carbon fiber (CF), talc, or nano fiber cellulose (CNF). According to one embodiment, the resin may include a rigidity reinforcing material in a range of about 10 wt % to 65 wt % in a thermoplastic resin. In another embodiment, the resin may include GF of about 30 wt % in the thermoplastic resin.

According to various embodiments of the disclosure, the resin including a high content of rigidity reinforcing material may be injected into a cavity through a hot runner injection mold so that no separate scrap occurs. In this case, the resin is injected through the side gate of the injection mold disposed to face at least one side surface of the side member; thus, a swelling phenomenon caused by a pin gate method or a phenomenon that an injection surface is unevenly formed may be prevented, according to the related art.

Figure 5:
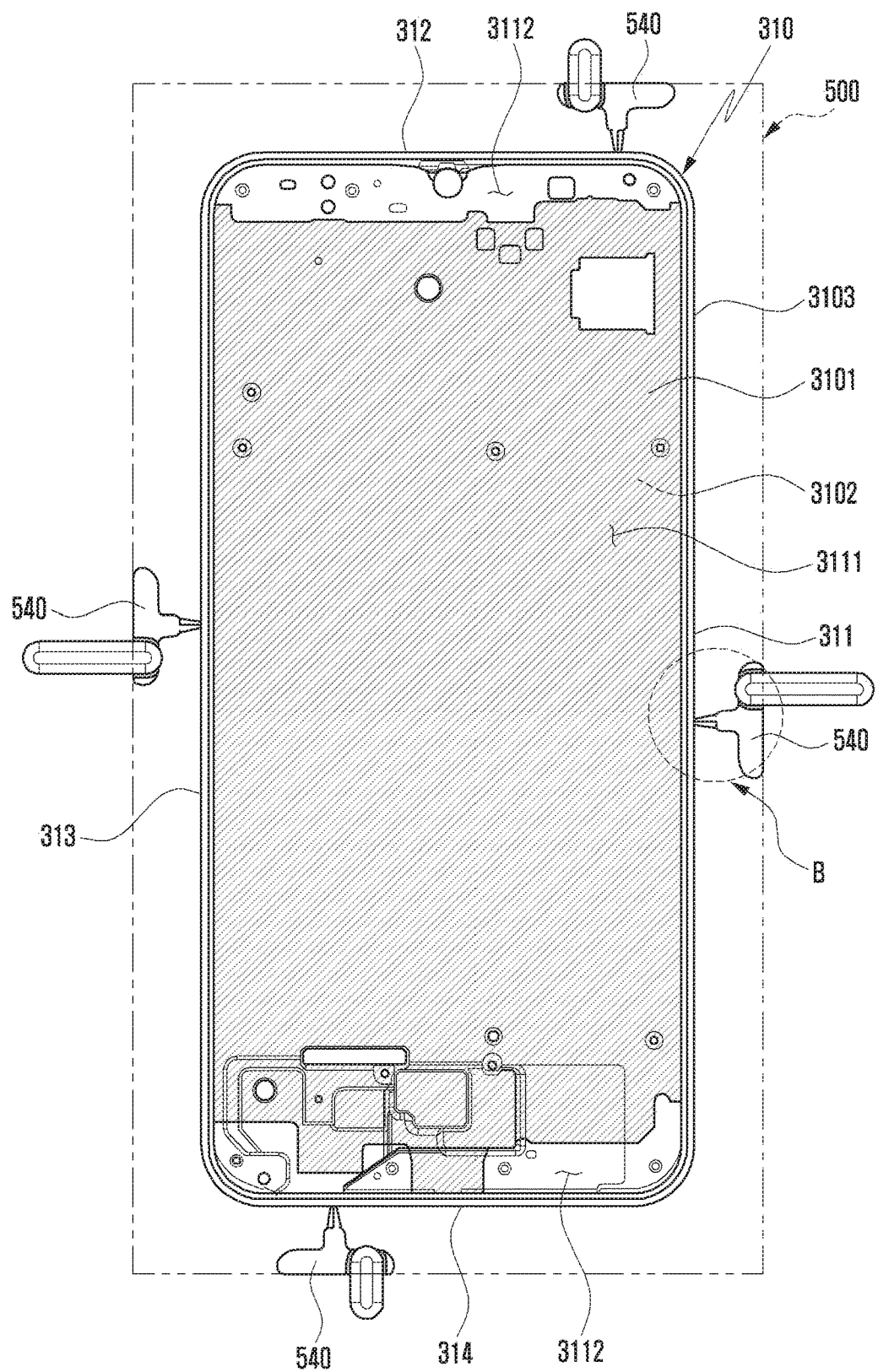
FIG. 5 is a diagram illustrating a state in which an injection mold is applied to form a side member according to an embodiment of the disclosure.

FIG. 5 is a diagram illustrating a state in which an injection mold is applied to form a side member (e.g., housing) 310 according to an embodiment of the disclosure.

Referring to FIG. 5, the side member (e.g., housing) 310 may include a conductive portion 3111 (e.g., metal member) and a non-conductive portion 3112 (e.g., polymer portion) insert injected into the conductive portion 3111. According to one embodiment, the side member 310 may include a front surface 3101 facing the front plate (e.g., the front plate 320 of FIG. 4B), a rear surface 3102 facing the rear plate (e.g., the rear plate 380 of FIG. 4B), and a side surface 3103 enclosing a space between the front surface 3101 and the rear surface 3102. According to an embodiment, the side surface 3103 may include a first side surface 311 having a first length, a second side surface 312 extended vertically from one end of the first side surface 311 and having a second length smaller than the first length, a third side surface 313 extended parallel to the first side surface 311 from the second side surface 312 and having a first length, and a fourth side surface 314 extended in parallel to the second side surface 312 from the third side surface 313 to the first side surface 311 and having a second length. According to an embodiment, the side member 310 is formed in a rectangular shape, but it may be formed in various other shapes according to a shape of the electronic device.

According to various embodiments, at least a portion of the non-conductive portion 3112 may be formed with at least one of the first side surface 311, the second side surface 312, the third side surface 313, or the fourth side surface 314 of the side member 310. According to one embodiment, at least a portion of the non-conductive portion 3112 may be extended from at least one of the first side surface 311, the second side surface 312, the third side surface 313, or the fourth side surface 314 to at least a portion of the front surface 3101 and/or the rear surface 3102.

According to various embodiments, after the conductive portion 3111 (e.g., metal member) formed into an appropriate shape is inserted into an injection mold 500 (e.g., hot runner injection mold), the side member 310 may be formed in a manner in which a high temperature resin is injected from a nozzle unit 540 through a side gate (e.g., the side gate 5111 of FIG. 6A) of the injection mold 500 formed at a position facing the side surface 3103. According to one embodiment, the high temperature resin may include a high content of rigidity reinforcing material, as described above.

According to various embodiments, when the side gate (e.g., a side gate 5111 of FIG. 6A) is applied in the hot runner injection mold 500, if at least one side gate (e.g., the side gate 5111 of FIG. 6A) is installed in each of a plurality of side surfaces (e.g., the first side surface 311, the second side surface 312, the third side surface 313, and the fourth side surface 314) in which the non-conductive portion 3112 is present, an excellent injection product (e.g., housing) may be formed.

Figure 6A:
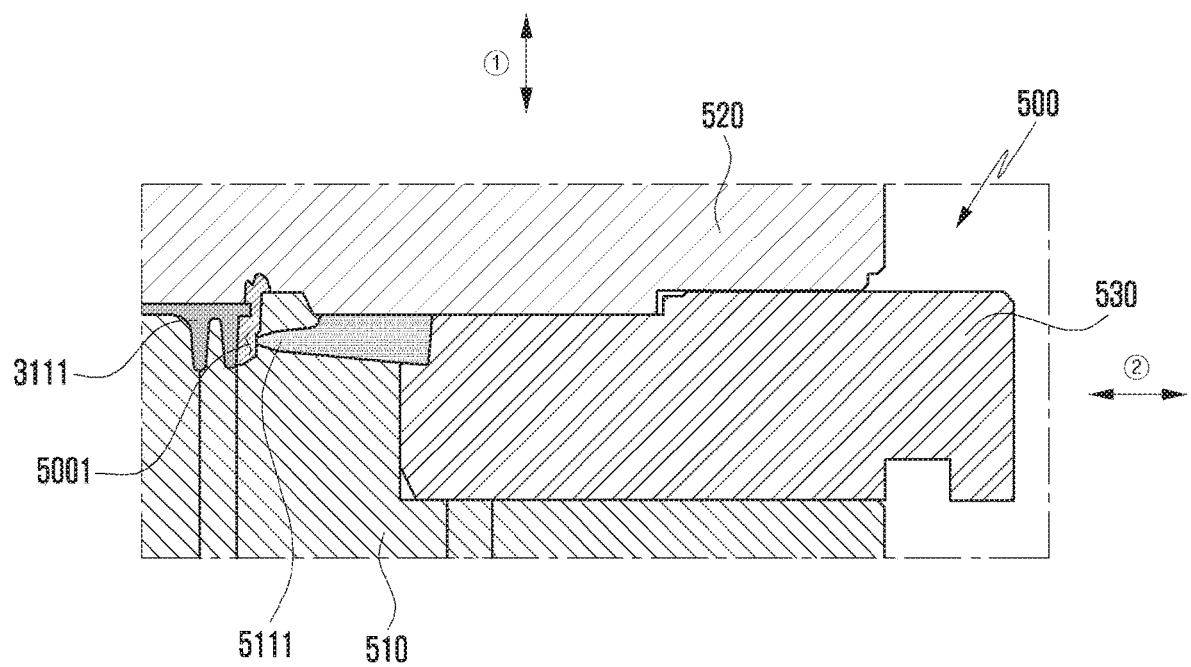
FIGS. 6A, 6B, and 6C are diagrams illustrating a configuration of an injection mold including a projection for receiving a gate mark according to various embodiments of the disclosure.
Figure 6B:
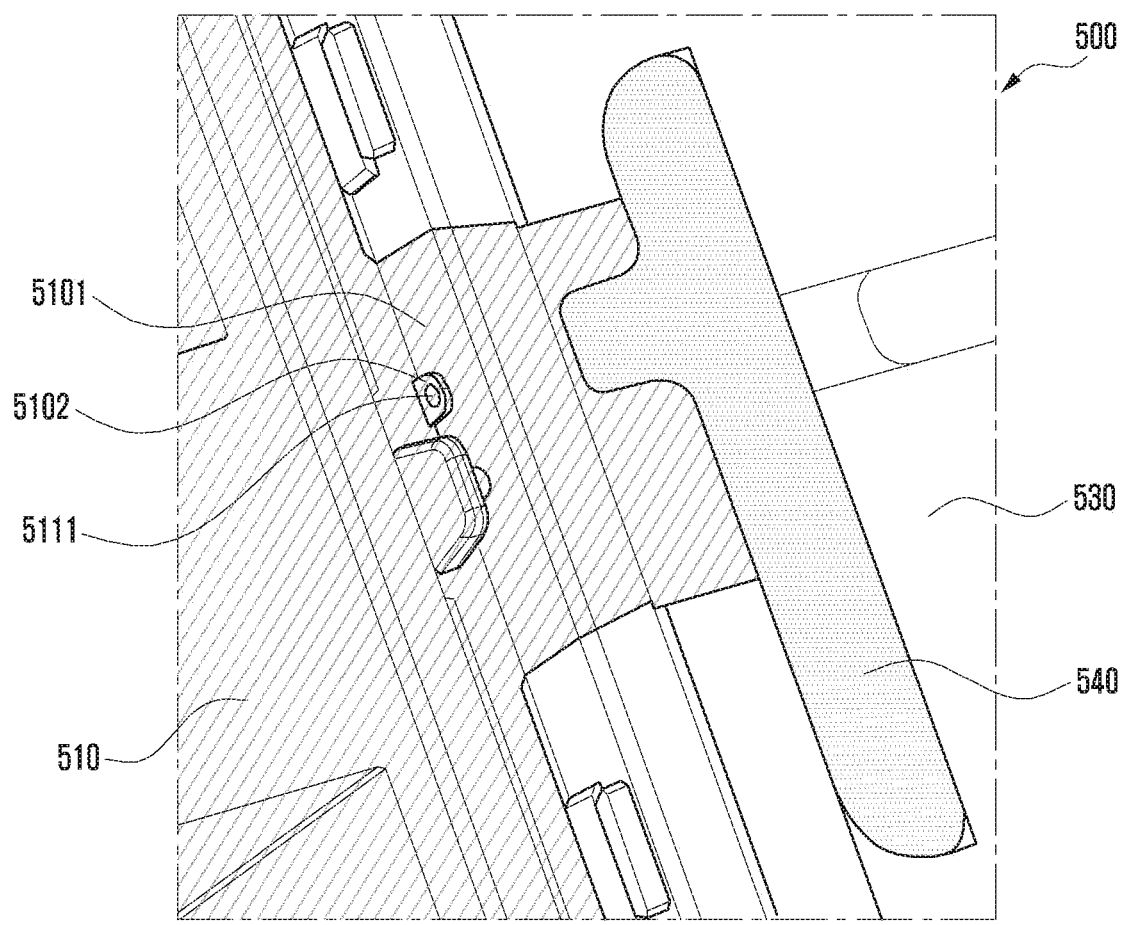
Figure 6C:
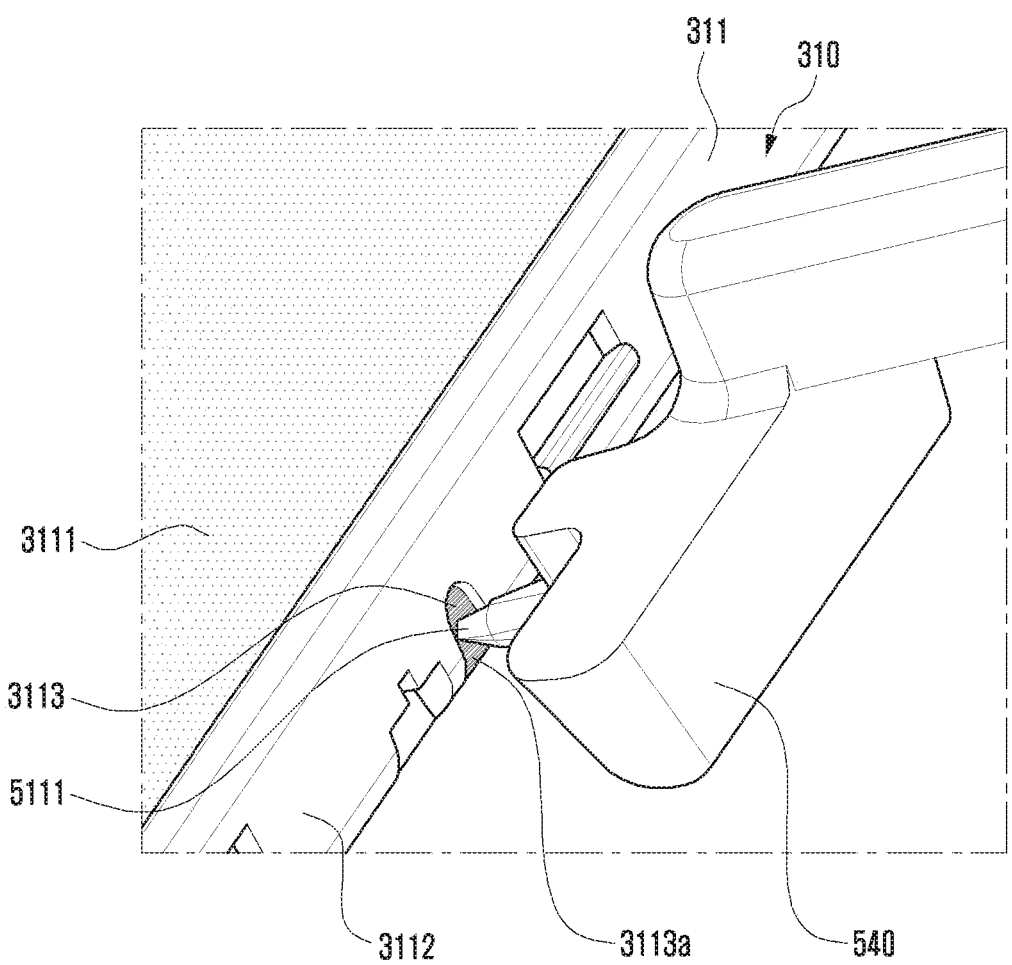

FIGS. 6A, 6B, and 6C are diagrams illustrating a configuration of an injection mold including a projection for receiving a gate mark according to various embodiments of the disclosure.

FIGS. 6A, 6B, and 6C specifically illustrate an area B for forming the first side surface 311 of FIG. 5, but the second side surface (e.g., the second side surface 312 of FIG. 5), the third side surface (e.g., the third side surface 313 of FIG. 5), or the fourth side surface (e.g., the fourth side surface 314 of FIG. 5) may be formed in the same manner.

Referring to FIG. 6A, the injection mold 500 (e.g., hot runner injection mold) may include a lower core 510 and upper core 520 opened or combined by reciprocating in a vertical direction (① direction). According to an embodiment, a conductive portion 3111 (e.g., metal member) formed in an appropriate shape may be inserted between the upper core 520 and the lower core 510. According to one embodiment, the injection mold 500 may include a cavity 5001 formed in a shape corresponding to a non-conductive portion (e.g., the non-conductive portion 3112 of FIG. 5) through a combination of the lower core 510, the upper core 520, and the conductive portion 3111. According to an embodiment, the injection mold 500 may include a side gate 5111 connected to the cavity 5001. According to an embodiment, the side gate 5111 may be formed in the lower core 510, but it may be formed by the lower core 510 or by combining the lower core 510 and the upper core 520. According to one embodiment, the injection mold 500 may include a slide core 530 including a nozzle unit (e.g., the nozzle unit 540 of FIG. 5) for injecting a high temperature resin into the cavity 5001 through the side gate 5111 by reciprocating in a horizontal direction (e.g., ② direction) between the lower core 510 and the upper core 520. Therefore, after the lower core 510, the upper core 520, and the slide core 530 are combined, the high temperature resin injected through the nozzle unit 540 of the slide core 530 may be injected into the cavity 5001 through the side gate 5111 and be insert injected with the conductive portion 3111, whereby a non-conductive portion (e.g., the non-conductive portion 3112 of FIG. 5) may be formed.

Referring to FIGS. 6B and 6C, the lower core 510 may include a protrusion 5102 protruded in a cavity direction from an inner side surface 5101 contacting the cavity 5001. According to an embodiment, the protrusion 5102 may include a side gate 5111. According to one embodiment, when the resin injected into the cavity 5001 is solidified by the above-described protrusion 5102, and when the non-conductive portion 3112 of the side member 310 is formed, the side member 310 may include a gate mark receiving groove 3113 formed lower than a side surface by the projection 5102. According to one embodiment, while the lower core 510, the upper core 520, and the slide core 530 are opened, the gate mark receiving groove 3113 may receive a gate mark (e.g., a gate mark 3114 of FIG. 7A) formed when the side gate 5111 is separated from the cavity 5001. This is because when the side member 310 formed by insert injection is coupled to another structure (e.g., rear plate), the side member 310 receives the gate mark (e.g., the gate mark 3114 of FIG. 7A) that may cause interference, thereby inducing smooth mechanical assembly between components and helping improve mass production. According to an embodiment, the gate mark receiving groove 3113 may include an open portion 3113a formed in a direction in which the lower core 510 is opened. In another embodiment, the side member 310 including the gate mark receiving groove 3113 may be advantageous when mechanically coupled to another structure (e.g., rear plate or rear case) formed with a non-conductive injection material.

Figure 7A:
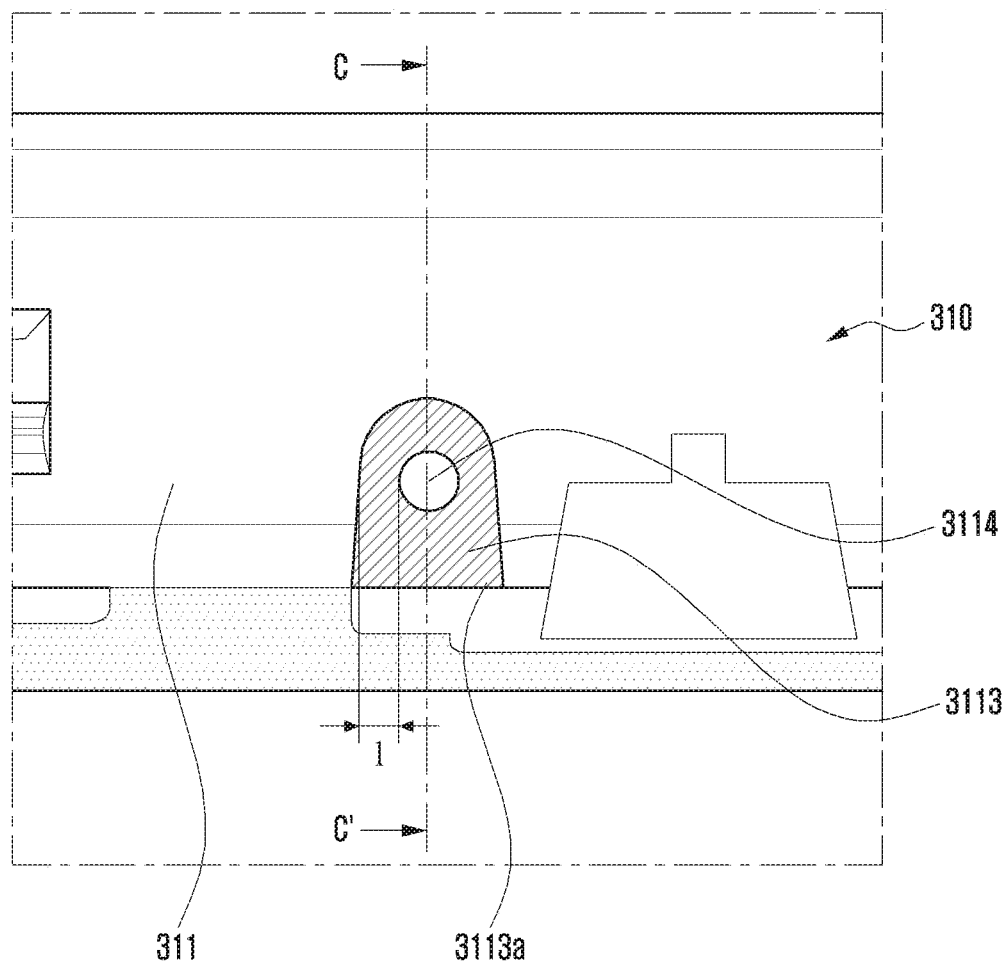
FIG. 7A is a diagram partially illustrating a side member including a gate mark receiving groove according to an embodiment of the disclosure.

FIG. 7A is a diagram partially illustrating a side member (e.g., housing) including a gate mark receiving groove according to an embodiment of the disclosure.

Figure 7B:
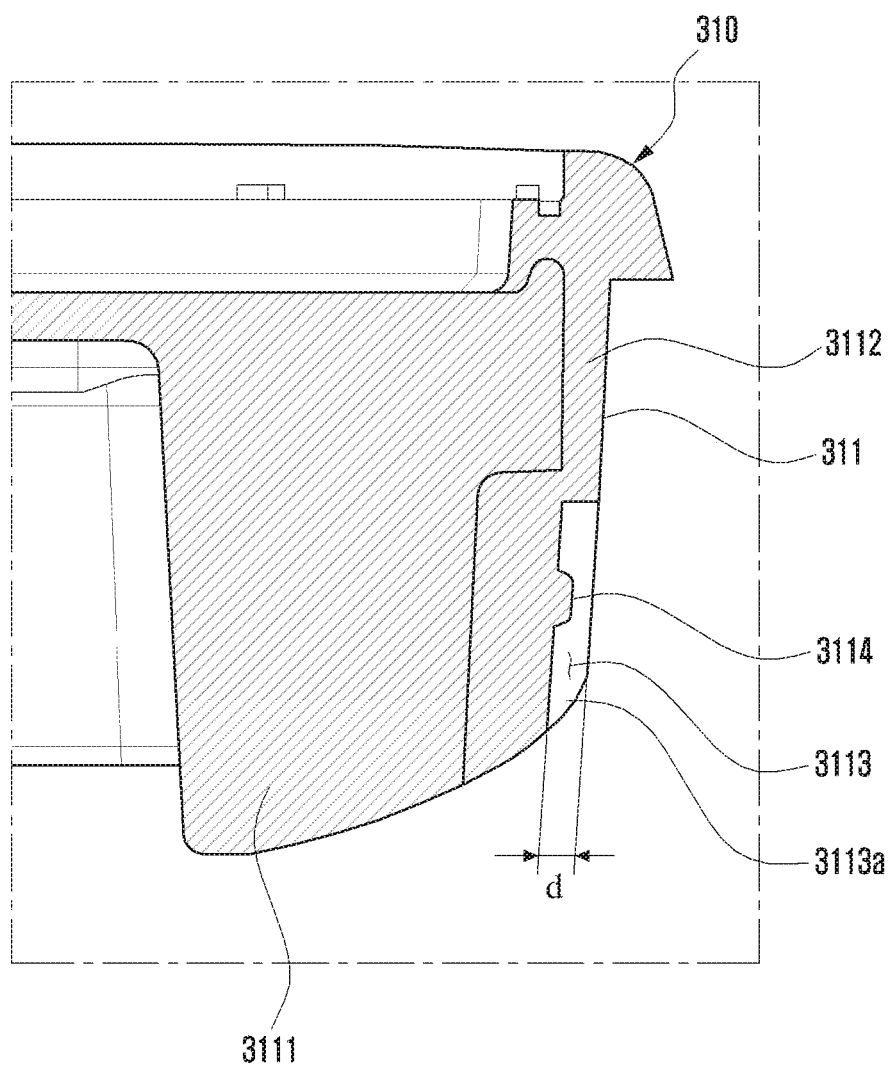
FIG. 7B is a cross-sectional view illustrating the side member taken along line C-C' of FIG. 7A, according to an embodiment of the disclosure.

FIG. 7B is a cross-sectional view illustrating the side member taken along line C-C' of FIG. 7A, according to an embodiment of the disclosure.

Referring to FIGS. 7A and 7B, the first side surface 311 of the side member 310 formed through the hot runner injection mold (e.g., the injection mold 500 of FIG. 6A) may include a gate mark 3114 formed by separation of the side gate (e.g., a side gate 5111 of FIG. 8A) of the injection mold. According to an embodiment, the gate mark 3114 may be formed in various shapes according to a separation condition of the injection mold, a shape of the gate, and the like, and be protruded from the first side surface 311. According to one embodiment, by causing interference with another structure (e.g., rear plate or rear case) mechanically coupled to the side member 310, such a gate mark 3114 may cause an assembly failure.

In an embodiment of the disclosure, the side member 310 may include a gate mark receiving groove 3113 formed lower than the first side surface 311 by a protrusion (e.g., the protrusion 5102 of FIG. 6B) protruded into a cavity (e.g., the cavity 5001 of FIG. 6A) of an injection mold (e.g., the injection mold 500 of FIG. 6A). According to one embodiment, as the gate mark 3114 formed by mold opening of the injection mold (e.g., the injection mold 500 of FIG. 6A) and separation of the side gate (e.g., the side gate 5111 of FIG. 6A) is formed inside the gate mark receiving groove 3113, interference that may occur when assembling with other components may be excluded. Therefore, the gate mark receiving groove 3113 may be formed to have at least a predetermined distance l in all directions from the gate mark 3114 to an edge of the gate tuck receiving groove 3113. According to one embodiment, the gate mark receiving groove 3113 may include an open portion 3113a formed in a direction in which the lower core (e.g., the lower core 510 of FIG. 6A) is opened by mold opening of the lower core (e.g., the lower core 510 of FIG. 6A). In another embodiment, when the side gate (e.g., the side gate 5111 of FIG. 6A) is disposed at an upper core (e.g., the upper core 520 of FIG. 6A), the open portion 3113a may be formed in an opposite direction, for example, in a direction in which the upper core (e.g., the upper core 520 of FIG. 6A) is opened. According to one embodiment, a predetermined distance l may be about 0.2 mm or more. According to an embodiment, the gate mark receiving groove 3113 may have a predetermined depth d so as not to protrude from the first side surface 311. According to an embodiment, the predetermined depth d may have a range of about 0.05 mm to 1 mm.

Figure 8A:

FIGS. 8A and 8B are diagrams illustrating a configuration of an injection mold including a groove for receiving a gate mark according to various embodiments of the disclosure.

Figure 8C:
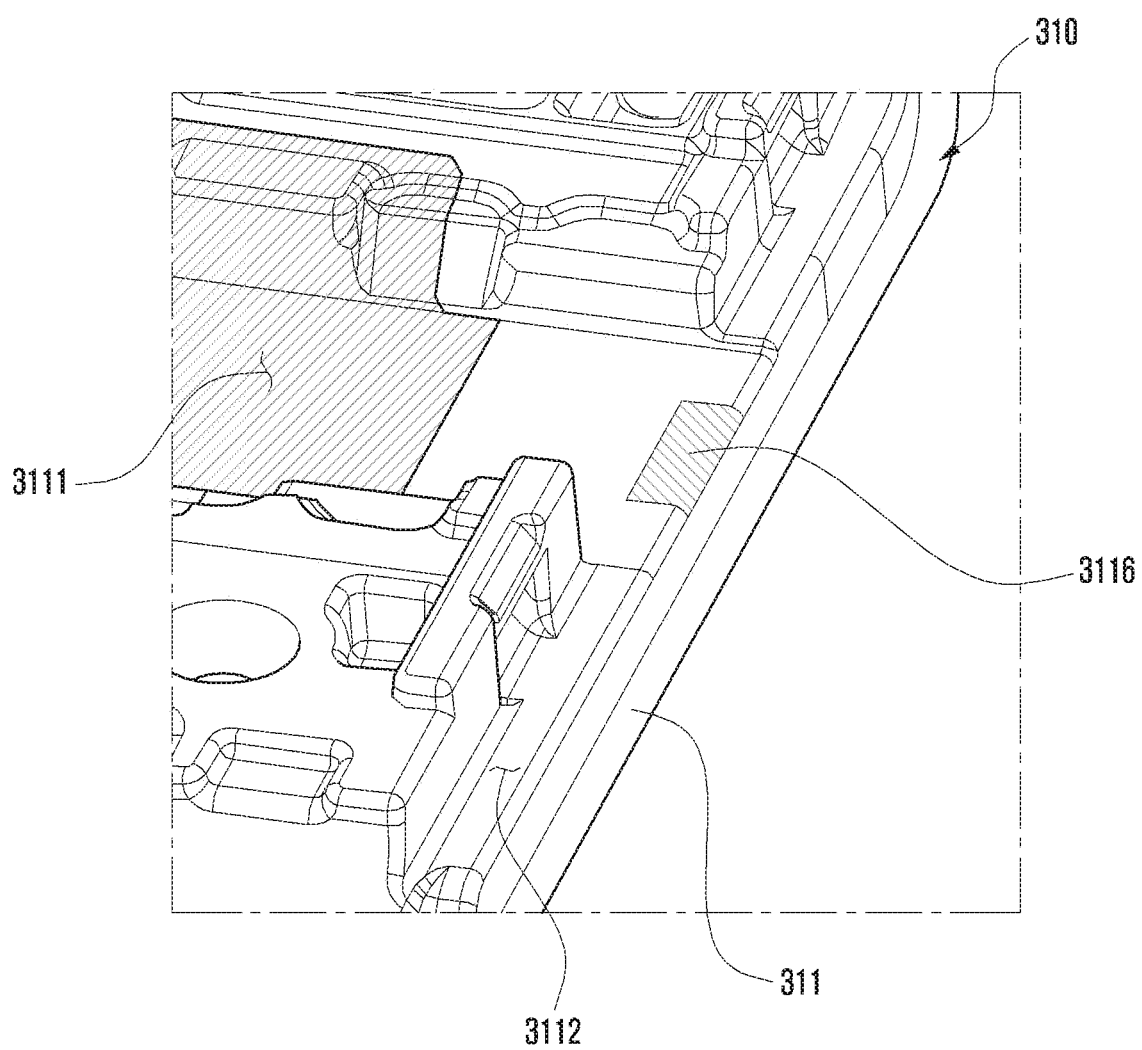
FIG. 8C is a diagram illustrating a state in which a gate receiving rib is removed from a side member according to an embodiment of the disclosure.

FIG. 8C is a diagram illustrating a state in which a gate mark receiving rib is removed from a side member according to an embodiment of the disclosure.

According to an embodiment of the disclosure, as described above, by the projection (e.g., 5102 of FIG. 6B), which is a processing portion formed in a part of the injection mold 500, in the side member 310 after injection, a gate mark receiving groove (e.g., the gate mark receiving groove 3113 of FIG. 7A) may be formed as a gate mark receiving portion.

In the embodiment, in the side member 310 as the gate mark receiving portion, a gate mark receiving rib 3115 for receiving a separate gate mark may be extended, and the gate mark receiving rib 3115 may be finally removed together with a gate mark to help improve assembly with another structure (e.g., rear plate or rear case).

In describing the injection mold of FIGS. 8A and 8B, detailed descriptions of components substantially the same as those of the injection mold of FIGS. 6A and 6B are omitted.

Referring to FIGS. 8A to 8C, an upper surface 5103 of the lower core 510 may include a groove 5104 of a predetermined depth formed to be connected to a cavity (e.g., the cavity 5001 of FIG. 6A). According to an embodiment, the groove 5104 may be formed from the upper surface 5103 of the lower core 510, and a side gate 5105 may be disposed inside the groove 5104. According to one embodiment, after the lower core 510, the upper core 520, and the slide core 530 are assembled, when a high temperature resin is injected into the cavity 5001 through the nozzle unit 540, the injected resin may be filled up to the groove 5104. According to one embodiment, when the injection mold 500 is opened, the side member 310 may include a gate mark receiving rib 3115 extended from at least a partial area of the first side surface 311. According to one embodiment, the gate mark receiving rib 3115 is a kind of dummy area for facing the side gate 5105, which may be finally cut by a cutting device (e.g., computer numerical control (CNC) machine); and, as illustrated in FIG. 8C, only a removal area 3116 may remain. Therefore, when the gate mark receiving rib 3115 is extended from the finally solidified side member 310, an assembly surface facing another structure (e.g., rear plate or rear case) may be extended from an avoided area.

Figure 9:
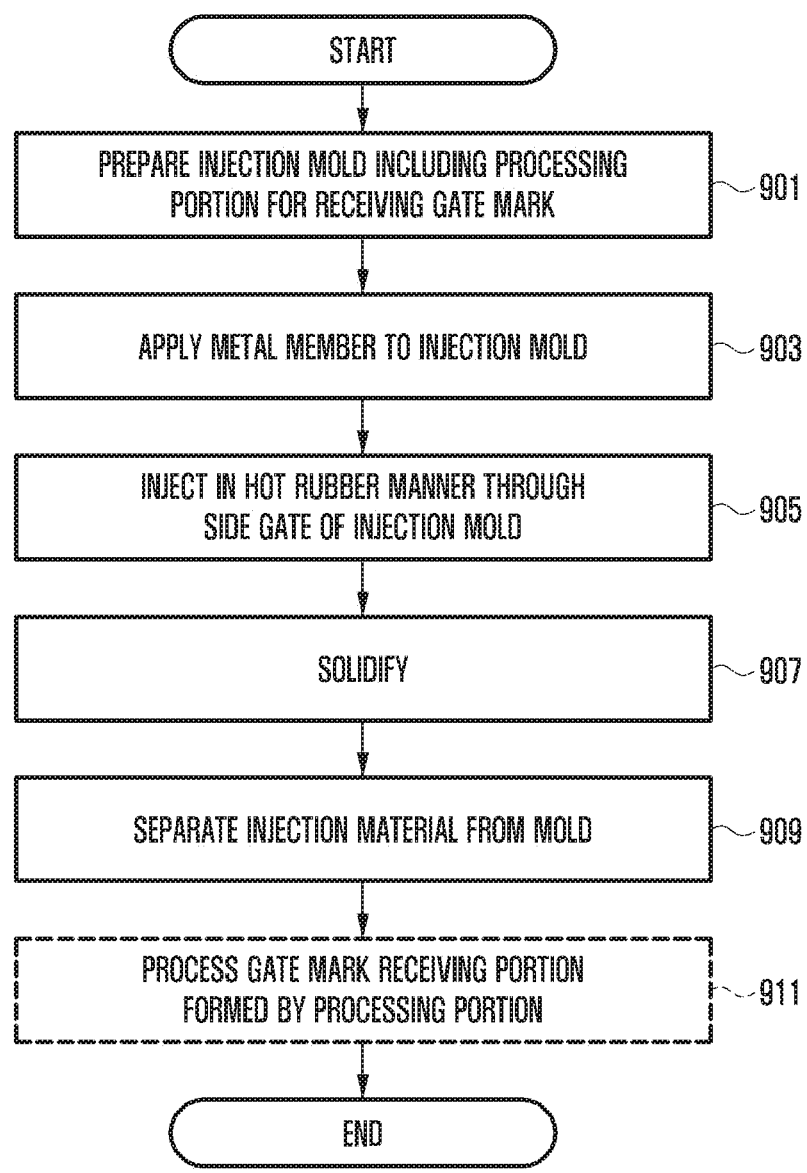
FIG. 9 is a flowchart illustrating a method of producing a housing through an injection mold according to an embodiment of the disclosure.

FIG. 9 is a flowchart illustrating a method of producing a housing (e.g., side member) through an injection mold according to an embodiment of the disclosure.

Referring to FIG. 9, in operation 901, an injection mold (e.g., the injection mold 500 of FIG. 6A) including a processing portion for receiving a gate mark may be prepared. According to one embodiment, the injection mold 500 may include a hot runner injection mold. According to one embodiment, the injection mold 500 may include a cavity (e.g., the cavity 5001 of FIG. 6A) formed through a combination of a lower core (e.g., the lower core 510 of FIG. 6A), an upper core (e.g., the upper core 520 of FIG. 6A), and/or a slide core (e.g., the slide core 530 of FIG. 6A). According to one embodiment, the processing portion may be connected to the cavity 5001 and may be formed through the lower core 510 and/or the upper core 520. According to an embodiment, the processing portion may include a side gate (e.g., the side gate 5111 of FIG. 6B or the side gate 5105 of FIG. 8A). According to one embodiment, the processed portion may include a protrusion (e.g., the protrusion 5102 of FIG. 6B) formed in at least a partial area of an injection product (e.g., the side member 310 of FIG. 7A) formed by the injection mold 500 and corresponding to a gate mark receiving groove (e.g., the gate mark receiving groove 3113 of FIG. 7A) receiving the gate mark (e.g., the gate mark 3114 of FIG. 7A). According to one embodiment, the processed portion may include a gate mark receiving rib (e.g., the gate mark receiving rib 3115 of FIG. 8B) extended in at least a partial area of an injection product (e.g., the side member 310 of FIG. 8B) formed by the injection mold 500 and receiving a gate mark.

According to various embodiments, in operation 903, a metal member (e.g., the conductive portion 3111 of the side member 310 of FIG. 5) may be applied to the injection mold. According to an embodiment, the metal member 3111 may be disposed to be connected to at least a portion of the cavity (e.g., the cavity 5001 of FIG. 6A).

According to various embodiments, in operation 905, an injection operation may be performed in a hot rubber manner through the side gate (e.g., the side gate 5111 of FIG. 6B or the side gate 5105 of FIG. 8A) of the injection mold 500. According to one embodiment, a high temperature resin including a high content of rigidity reinforcement material may be injected from the nozzle unit (e.g., the nozzle unit 540 of FIG. 5) into the cavity 5001 through the side gate (e.g., the side gate 5111 of FIG. 6B or the side gate 5105 of FIG. 8A) formed through the lower core 510 and/or the upper core 520.

According to various embodiments, in operations 907 and 909, after the injection product (e.g., side member) is solidified, an operation of separating the injection product from the mold 500 may be performed. According to an embodiment, operations 907 and 909 may be performed at the same time. According to one embodiment, the injection product (e.g., side member) solidified and separated from the injection mold 500 may be put into a process for assembling with other structures (e.g., rear plate or rear case). For example, the gate mark receiving portion may be formed lower than a surface of the injection product, and when the gate mark receiving portion is the gate mark receiving groove (e.g., the gate mark receiving groove 3113 of FIG. 7A), a separate post-processing may not be required.

According to various embodiments, in operation 911, the gate mark receiving portion formed by the processing portion may be post-processed. For example, when the gate mark receiving portion is a gate mark receiving rib (e.g., the gate mark receiving rib 3115 of FIG. 8B) extended from a surface of the injection material and including the gate mark, after the injection material is completely solidified, the gate mark receiving portion may be cut through a separate mechanical processing (e.g., CNC machining).

According to various embodiments, in describing the disclosure, a housing and/or a side member in which a non-conductive portion (polymer portion) is at least partially insert injected into a conductive portion (e.g., metal portion) are(is) illustrated and described, but the disclosure is not limited thereto. For example, the gate mark receiving groove (e.g., the gate mark receiving groove 3113 of FIG. 7A) and/or the gate mark receiving rib (e.g., the gate mark receiving rib 3115 of FIG. 8B) may be applied even to an injection material formed with only a non-conductive portion (e.g., polymer). In another embodiment, the gate mark receiving groove (e.g., the gate mark receiving groove 3113 of FIG. 7A) and/or the gate mark receiving rib (e.g., the gate mark receiving rib 3115 of FIG. 8B) may be applied when forming an injection material of a general polymer material without a high content of rigidity reinforcement material.

Even if a high content of rigidity reinforcing material is included, the housing produced according to various embodiments of the disclosure is formed through a hot runner type injection mold; thus, scrap is not generated after injection, thereby helping to reduce a production cost of the electronic device.

According to various embodiments, an electronic device (e.g., the electronic device 300 of FIG. 3) includes a housing (e.g., the housing 110 of FIG. 1) including a first plate (e.g., the first plate 320 of FIG. 3), a second plate (e.g., the second plate 380 of FIG. 3) facing in a direction opposite to that of the first plate, and a side member (e.g., the side member 310 of FIG. 4B) enclosing a space (e.g., the space 3001 of FIG. 4B) between the first plate and the second plate and formed with a method of solidifying a resin including a predetermined amount of rigidity reinforcing material injected into an injection mold (e.g., the injection mold 500 of FIG. 6A) and including a plurality of side surfaces (e.g., the first side surface 311, the second side surface 312, the third side surface 313, and fourth side surface 314 of FIG. 5); and a gate mark receiving portion (e.g., the gate mark receiving groove 3113 of FIG. 7A or the gate mark receiving rib 3115 of FIG. 8B) formed in each of the plurality of side surfaces of the side member and configured to receive at least one gate mark (e.g., the gate mark 3114 of FIG. 7A) according to separation of the injection mold, wherein the gate mark receiving portion is formed by a processing portion disposed at a corresponding position inside a cavity (e.g., the cavity 5001 of FIG. 6A) of the injection mold.

According to various embodiments, the processing portion may include a protrusion (e.g., the protrusion 5102 of FIG. 6B) disposed inside the cavity of the injection mold and having a side gate (e.g., the side gate 5111 of FIG. 6B), and wherein the gate mark receiving portion may include a gate mark receiving groove (e.g., the gate mark receiving groove 3113 of FIG. 7A) formed lower than a surface of each of the plurality of side surfaces by the protrusion at a corresponding position of the side surface and including the at least one gate mark.

According to various embodiments, a distance (e.g., the distance 1 of FIG. 7A) from an edge of the gate mark receiving groove to the at least one gate mark may be about 0.3 mm or more.

According to various embodiments, a depth (e.g., the depth of FIG. 7B) of the gate mark receiving groove may have a range of about 0.05 mm to 1 mm.

According to various embodiments, the processing portion may be disposed inside the cavity of the injection mold and include a groove (e.g., the groove 5104 of FIG. 8A) having a side gate (e.g., the side gate 5105 of FIG. 8A), wherein the gate mark receiving portion may include a gate mark receiving rib (e.g., the gate mark receiving rib 3115 of FIG. 8B) extended by the groove in a predetermined height in the first plate direction and/or the second plate direction from each of the plurality of side surfaces and formed to include the at least one gate mark.

According to various embodiments, the gate mark receiving rib may be removed after the side member is solidified.

According to various embodiments, the gate mark receiving rib may be formed to avoid a coupling surface in which the side member is coupled to another structure.

According to various embodiments, the side member (e.g., the side member 310 of FIG. 5) may include a first side surface (e.g., the first side surface 311 of FIG. 5) having a first length; a second side surface (e.g., the second side surface 312 of FIG. 5) extended vertically from one end of the first side surface and having a second length smaller than the first length; a third side surface (e.g., the third side surface 313 of FIG. 5) extended parallel to the first side surface from the second side surface and having the first length; and a fourth side surface (e.g., the fourth side surface 314 of FIG. 5) extended parallel to the second side surface from the third side surface to the first side surface and having the second length, wherein the gate mark receiving portion may be formed at each of the first side surface, the second side surface, the third side surface, or the fourth side surface.

According to various embodiments, the resin may include a rigidity reinforcing material configured with at least one of glass fiber (GF), mineral filler (MF), carbon fiber (CF), talc, or cellulose nano fiber (CNF) and having a content of about 10 wt % to 65 wt % in a thermoplastic resin.

According to various embodiments, an electronic device (e.g., the electronic device 300 of FIG. 3) includes a housing (e.g., the housing 110 of FIG. 1) including a first plate (e.g., the first plate 320 of FIG. 3), a second plate (e.g., the second plate 380 of FIG. 3) facing in a direction opposite to that of the first plate, and a side member (e.g., the side member 310 of FIG. 4B) enclosing a space (e.g., the space 3001 of FIG. 4B) between the first plate and the second plate and including a plurality of side surfaces (e.g., the first side surface 311, the second side surface 312, the third side surface 313, and fourth side surface 314 of FIG. 5); and at least one gate mark (e.g., the gate mark 3114 of FIG. 7A) formed in each of the plurality of side surfaces of the side member, wherein the side member is injected as a resin including a rigidity reinforcement material having a predetermined content.

According to various embodiments, the at least one gate mark may be disposed in a gate mark receiving recess formed lower than a corresponding side surface at each of the plurality of side surfaces.

According to various embodiments, the gate mark receiving groove may include an open portion (e.g., the open portion 3113a of FIG. 7A) formed in the first plate direction and/or the second plate direction.

According to various embodiments, the resin may include a rigidity reinforcing material configured with at least one of glass fiber (GF), mineral filler (MF), carbon fiber (CF), talc, or cellulose nano fiber (CNF) and having a content of about 10 wt % to 65 wt % in a thermoplastic resin.

According to various embodiments, a housing formed by a method of solidifying a resin injected into the injection mold includes a front surface; a rear surface facing in a direction opposite to that of the front surface; a plurality of side surfaces (e.g., the first side surface 311, the second side surface 312, the third side surface 313, and fourth side surface 314 of FIG. 5) enclosing a space between the front surface and rear surface; and a gate mark receiving portion formed at each of the plurality of side surfaces and configured to receive at least one gate mark (e.g., the gate mark 3114 of FIG. 7A) according to separation of the injection mold, wherein the gate mark receiving portion may be formed by a processing portion disposed at a corresponding position inside a cavity of the injection mold.

According to various embodiments, the processing portion may include a protrusion disposed inside the cavity of the injection mold and having a side gate, and wherein the gate mark receiving portion may include a gate mark receiving groove formed to include the at least one gate mark by the protrusion at a corresponding position of the side surface.

According to various embodiments, the processing portion may be disposed inside the cavity of the injection mold and include a groove having a side gate, and wherein the gate mark receiving portion may include a gate mark receiving rib extended by the groove in a predetermined height in the front direction and/or the rear direction from each of the plurality of side surfaces and formed to include the at least one gate mark.

According to various embodiments, the resin may include a rigidity reinforcing material configured with at least one of glass fiber (GF), mineral filler (MF), carbon fiber (CF), talc, or cellulose nano fiber (CNF) and having a content of about 10 wt % to 65 wt % in a thermoplastic resin.

According to various embodiments, a method of producing a housing includes forming a processing portion at a corresponding location inside a cavity of an injection mold corresponding to a gate mark receiving unit configured to receive at least one gate mark formed in each of a plurality of side surfaces of the housing; and forming the housing through solidification of a resin including a predetermined amount of rigidity reinforcing material injected through a side gate connected to the cavity.

According to various embodiments, the processing portion may include a protrusion formed to have the side gate inside the cavity, and wherein the gate mark receiving portion may include a gate mark receiving groove formed to include the at least one gate mark by the protrusion at a corresponding position of each of the plurality of side surfaces.

According to various embodiments, the method may further include forming the resin with a rigidity reinforcing material configured with at least one of glass fiber (GF), mineral filler (MF), carbon fiber (CF), talc, or cellulose nano fiber (CNF) and having a content of about 10 wt % to 65 wt % in a thermoplastic resin.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing comprising:
a first plate,
a second plate facing in a direction opposite to that of the first plate, and
a side member enclosing a space between the first plate and the second plate, the side member formed with a method of solidifying a resin comprising a predetermined amount of rigidity reinforcing material injected into an injection mold and the side member comprising a plurality of side surfaces; and
a gate mark receiving portion formed in each of the plurality of side surfaces of the side member and the gate mark receiving portion being configured to receive at least one gate mark according to a separation of the injection mold,
wherein the gate mark receiving portion is formed by a processing portion disposed at a corresponding position inside a cavity of the injection mold,
wherein the processing portion comprises a protrusion disposed inside the cavity of the injection mold, and the processing portion comprising a side gate, and
wherein the gate mark receiving portion comprises a gate mark receiving groove formed lower than a surface of each of the plurality of side surfaces by the protrusion at a corresponding position of the side member and comprising the at least one gate mark.

2. The electronic device of claim 1, wherein a distance from an edge of the gate mark receiving groove to the at least one gate mark is substantially 0.3 mm.

3. The electronic device of claim 1, wherein a depth of the gate mark receiving groove has a range of 0.05 mm to 1 mm.

4. The electronic device of claim 1,
wherein the gate mark receiving portion further comprises a gate mark receiving rib extended by a groove in a predetermined height in at least one of a first plate direction or a second plate direction from each of the plurality of side surfaces and formed to comprise the at least one gate mark.

5. The electronic device of claim 4, wherein the gate mark receiving rib is removed after the side member is solidified.

6. The electronic device of claim 4, wherein the gate mark receiving rib is formed to avoid a coupling surface in which the side member is coupled to another structure.

7. The electronic device of claim 1,
wherein the side member comprises:
a first side surface of the plurality of side surfaces, the first side surface forming in a first length;
a second side surface of the plurality of side surfaces, the second side surface extending vertically from one end of the first side surface and comprising a second length smaller than the first length;
a third side surface of the plurality of side surfaces, the third side surface extending parallel to the first side surface from the second side surface and comprising the first length; and
a fourth side surface of the plurality of side surfaces, the fourth side surface extending parallel to the second side surface from the third side surface to the first side surface and comprising the second length, and
wherein the gate mark receiving portion is formed at each of the first side surface, the second side surface, the third side surface, and the fourth side surface.

8. The electronic device of claim 1, wherein the resin comprises the rigidity reinforcing material configured with at least one of glass fiber (GF), mineral filler (MF), carbon fiber (CF), talc, or cellulose nano fiber (CNF) and comprising a content of about 10 wt % to 65 wt % in a thermoplastic resin.

9. An electronic device, comprising:
a housing comprising:
a first plate,
a second plate facing in a direction opposite to that of the first plate, and
a side member enclosing a space between the first plate and the second plate, and, the side member comprising a plurality of side surfaces; and at least one gate mark formed in each of the plurality of side surfaces of the side member, wherein the side member is injected as a resin comprising a rigidity reinforcement material comprising a predetermined content, wherein the at least one gate mark is disposed in a gate mark receiving groove formed lower than a corresponding side surface at each of the plurality of side surfaces, and wherein the gate mark receiving groove comprises an open portion formed in at least one of a first plate direction/or a second plate direction.

10. The electronic device of claim 9, wherein the resin comprises the rigidity reinforcing material configured with at least one of glass fiber (GF), mineral filler (MF), carbon fiber (CF), talc, or cellulose nano fiber (CNF) and comprising a content of about 10 wt % to 65 wt % in a thermoplastic resin.

11. A housing formed by a method of solidifying a resin injected into an injection mold, the housing comprising:
a front surface;
a rear surface facing in a direction opposite to that of the front surface;
a plurality of side surfaces enclosing a space between the front surface and the rear surface; and
a gate mark receiving portion formed at each of the plurality of side surfaces, the gate mark receiving portion being configured to receive at least one gate mark according to a separation of the injection mold,
wherein the gate mark receiving portion is formed by a processing portion disposed at a corresponding position inside a cavity of the injection mold,
wherein the processing portion comprises a protrusion disposed inside the cavity of the iniection mold and comprising a side gate, and
wherein the gate mark receiving portion comprises a gate mark receiving groove formed to comprise the at least one gate mark by the protrusion at a corresponding position of the side surface.

12. The housing of claim 11,
wherein the gate mark receiving portion further comprises a gate mark receiving rib extended by a groove in a predetermined height in at least one of a front direction or a rear direction from each of the plurality of side surfaces and formed to comprise the at least one gate mark.

13. The housing of claim 11, wherein the resin comprises a rigidity reinforcing material configured with at least one of glass fiber (GF), mineral filler (MF), carbon fiber (CF), talc, or cellulose nano fiber (CNF) and comprising a content of about 10 wt % to 65 wt % in a thermoplastic resin.

14. A method of producing a housing, the method comprising:
forming a first plate and a second plate, the second plate facing in a direction opposite to that of the first plate, and
forming a processing portion at a corresponding location inside a cavity of an injection mold corresponding to a gate mark receiving portion configured to receive at least one gate mark formed in each of a plurality of side surfaces of the housing, wherein the plurality of side surfaces enclose a space between the first plate and the second plate; and
forming the housing through solidification of a resin comprising a predetermined amount of rigidity reinforcing material injected through a side gate connected to the cavity,
wherein the processing portion comprises a protrusion disposed inside the cavity of the infection mold, and the processing portion comprising a side gate, and
wherein the gate mark receiving portion comprises a gate mark receiving groove formed lower than a surface of each of the plurality of side surfaces by the protrusion at a corresponding position of a side member and comprising the at least one gate mark.

15. The method of claim 14, further comprising forming the resin with the rigidity reinforcing material configured with at least one of glass fiber (GF), mineral filler (MF), carbon fiber (CF), talc, or cellulose nano fiber (CNF) and comprising a content of about 10 wt % to 65 wt % in a thermoplastic resin.

* * * * *